United States Patent [19]

Lombardi

[11] 4,280,689
[45] Jul. 28, 1981

[54] HEAD FOR HIGH SPEED SPINNER HAVING A VACUUM CHUCK

[76] Inventor: Robert A. Frosch, Administrator of the National Aeronautics and Space Administration, with respect to an invention of Frank Lombardi, Altadena, Calif.

[21] Appl. No.: 163,840

[22] Filed: Jun. 27, 1980

[51] Int. Cl.³ .................................................. B60G 11/22
[52] U.S. Cl. ......................................... 269/21; 118/50; 118/52; 427/240
[58] Field of Search ........................... 118/52–57, 118/50, 50.1; 427/238, 240, 241; 34/8, 58, 59; 51/235; 269/21

[56] References Cited

U.S. PATENT DOCUMENTS

| | | | |
|---|---|---|---|
| 3,389,682 | 6/1968 | Gardner | 118/52 |
| 3,426,727 | 2/1969 | Balain et al. | 118/52 |
| 3,730,134 | 5/1973 | Kadi | 118/52 X |
| 3,791,342 | 2/1974 | Boyer et al. | 118/52 |
| 4,103,643 | 8/1978 | Staunton | 118/52 X |
| 4,184,292 | 1/1980 | DeFazio et al. | 269/21 X |

OTHER PUBLICATIONS

*IBM Technical Disclosure Bulletin,* vol. 14, No. 10 (Mar. 1972) Walker "Wafer Holder," pp. 3015–3016.

*Primary Examiner*—Shrive P. Beck
*Attorney, Agent, or Firm*—Monte F. Mott; John R. Manning; Thomas H. Jones

[57] ABSTRACT

A head 10 for a high-speed spinner characterized by a substantially cylindrical body adapted to be mounted at the distal end of a vertically oriented drive shaft 16 and including a vacuum chuck having an upwardly facing chamber 30 circumscribed by an annular surface 32 for receiving in supported relation a silicon chip, and an ordered array of low-pressure cavities defined about the periphery of the body and connected in communication with the chamber via radially extended bores 38 for translating low pressures to the chamber 30 as the head is angularly displaced, whereby a pressure differential is established across the chip for securing it to the head.

1 Claim, 4 Drawing Figures

HEAD FOR HIGH SPEED SPINNER HAVING A VACUUM CHUCK

ORIGIN OF THE INVENTION

The invention described herein was made in the performance of work under a NASA Contract and is subject to the provisions of Section 305 of the National Aeronautics & Space Act of 1958, Public Law 85-568 (72 STAT 435; 42 U.S.C. 2457).

BACKGROUND OF THE INVENTION

The invention generally relates to variable-speed spinners employed in depth profiling fragile blanks of $SIO_2$, herein referred to as silicon "chips" utilizing an etchant, and more particularly to an improved head for a high-speed spinner characterized by a negative pressure or vacuum chuck adapted to support a silicon chip as a high-angular velocity is imparted to the head during the performance of profile etching processes.

In the profiling of silicon chips utilizing an etchant, the processing frequently requires formation of steps having dimensions in the ranges of tens of angstroms with a precision of ±1 Å. To accommodate such precise profiling, a variable-speed spinner is employed for angularly displacing the workpiece at an angular rate of 2,000 to in excess of 100,000 RPM. Consequently, the chuck employed for supporting the workpiece must be capable of securing the workpiece to the head of the spinner at high-angular rates of rotation, without fracturing or otherwise damaging the chips.

To accomplish the desired results, a negative pressure sample holding block, herein referred to as a "vacuum chuck" has been provided.

During the course of a preliminary search conducted for the invention, hereinafter more fully described, the following patents were discovered:

| | | |
|---|---|---|
| 3,389,682 | L.D. Gardner | June 25, 1968 |
| 3,730,134 | Kadi | May 1, 1973 |
| 4,024,835 | Scheu et al | May 24, 1977 |
| 4,184,292 | DeFazio et al | January 22, 1980 |

It is believed that the high-speed vacuum chuck disclosed by U.S. Pat. No. 3,389,682 comprises the most pertinent prior art discovered in the course of the search. However, it also is believed to be abundantly apparent that this device necessarily is incapable of performing the functions required by those engaged in the etching of profiles in silicon chips utilizing high-speed spinners.

It is therefore the general purpose of the instant invention to provide a head for a vertically oriented, high-speed spinner having a vacuum chuck particularly suited for protectively and securely supporting fragile objects, such as silicon chips, and the like, as they are rotated at high angular rates.

OBJECTS AND SUMMARY OF THE INVENTION

It is an object of the invention to provide an improved head for a vertically oriented, high-speed spinner.

It is another object to provide in combination with a head for a vertically-oriented, high-speed spinner, a vacuum chuck.

It is another object to provide a simple, practical, reliable, economic head for a vertically oriented, remotely-controlled, high-speed spinner adapted to be utilized in processing silicon chips in a confined, highly toxic environment.

These and other objects and advantages are achieved through the use of a cylindrical head having defined therein a concentric vacuum chuck characterized by a vacuum chamber connected through a plurality of radially extended bores to a plurality of uniformly spaced, low-pressure cavities defined in the periphery of the head whereby low-pressure regions are developed in the cavity and translated to the vacuum chamber in response to a resultant airstream passed thereover as the head is rotated at a high angular rate, as will become more readily apparent by reference to the following description and claims in light of the accompanying drawings.

DESCRIPTION OF THE PREFERRED EMBODIMENT

Figure 1:
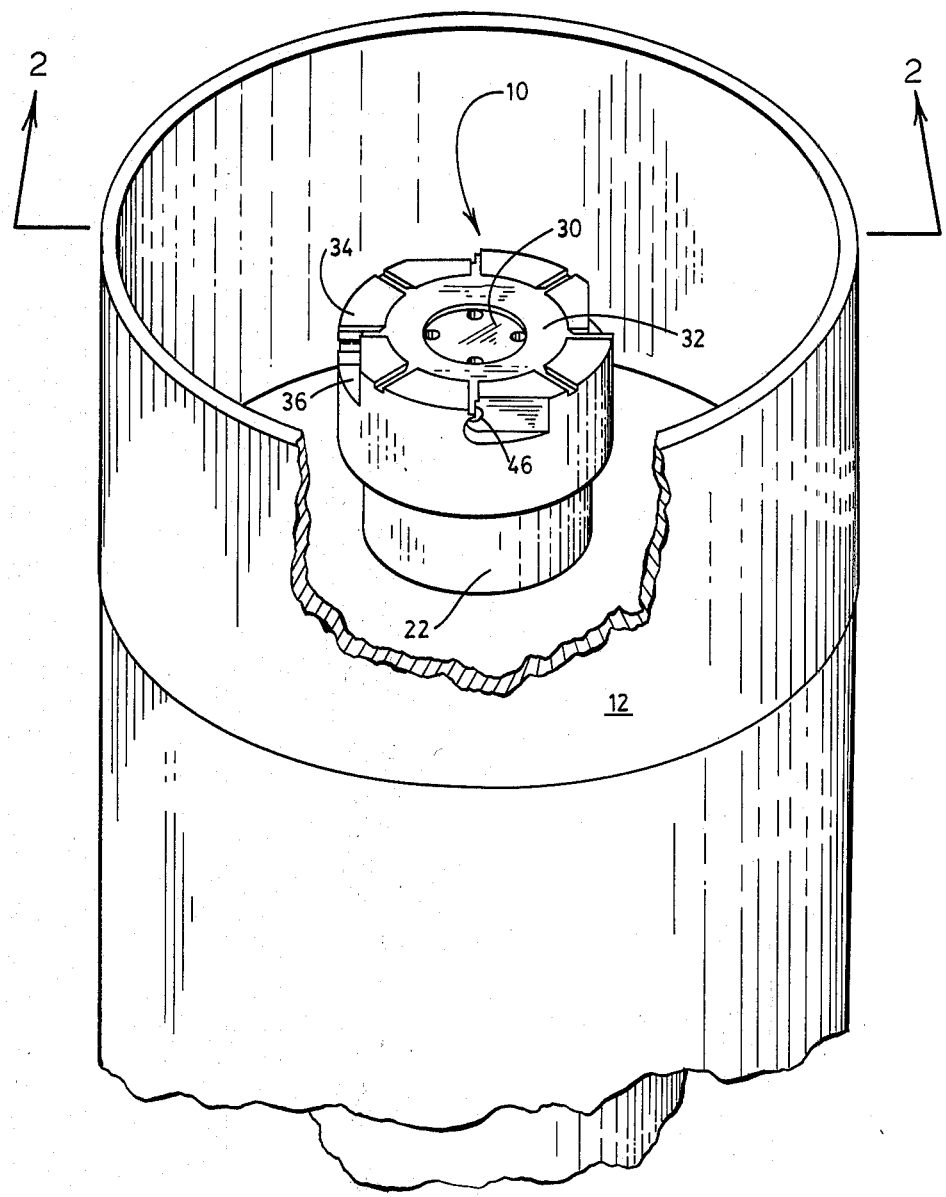
FIG. 1 is a fragmented, perspective view of a high-speed spinner having a head embodying the principles of the instant invention.

Referring now to the drawings, with more particularity, wherein like reference characters designate like or corresponding parts throughout the several views, there is shown in FIG. 1, a high-speed spinner having a unique head, generally designated 10, which embodies the principles of the instant invention.

As shown in FIG. 1, the head 10 is of a substantially cylindrical configuration and is concentrically seated within a bowl 12, also of a cylindrical configuration, forming a part of the spinner 10.

Figure 2:
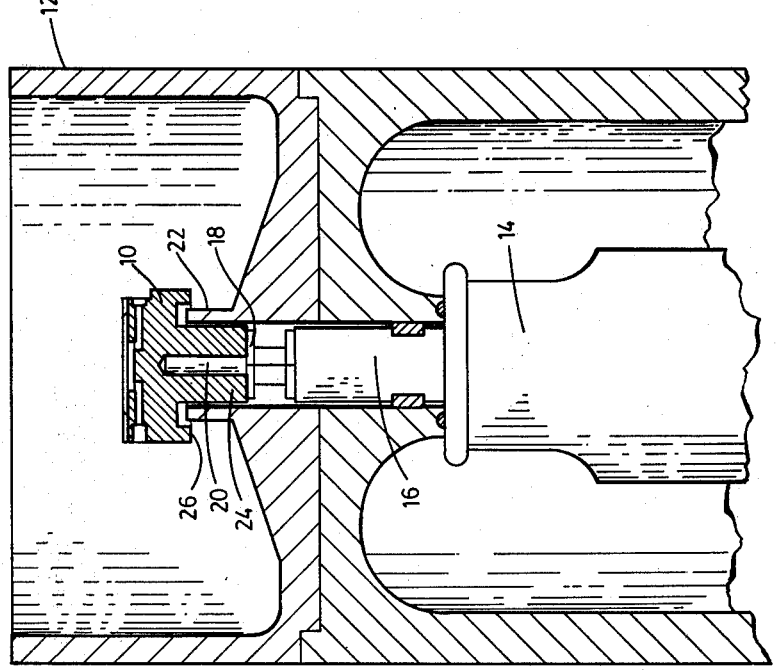
FIG. 2 is a fragmented, cross-sectional view taken generally along lines 2—2 of FIG. 1, but on an enlarged scale.

The head 10 is fabricated from a suitable material such as a synthetic resin, characterized by a capability of substantially withstanding the deleterious effects of the etchant used in profiling operations for silicon chips. As illustrated in FIG. 2, the spinner is provided with a high-speed motor 14 of suitable design. As currently employed, the motor 14 is characterized by a vertically oriented drive shaft 16 suitably supported for rotation about an axis passing vertically through the head 10. In practice, the motor 14 comprises a dry-nitrogen driven turbine adapted to impart to the shaft 16 a variable rate in a range extending from 2,000 to 100,000 RPM. Since the details of the motor 14 and the shaft 16 form no part of the claimed invention, a detailed discussion thereof is omitted in the interest of brevity. However, it should be apparent that the head 10 is affixed to the distal end of the shaft 16, preferably through the use of a chuck 18 comprising a collet adapted to receive a mounting pin 20 for the head 10.

Figure 3:
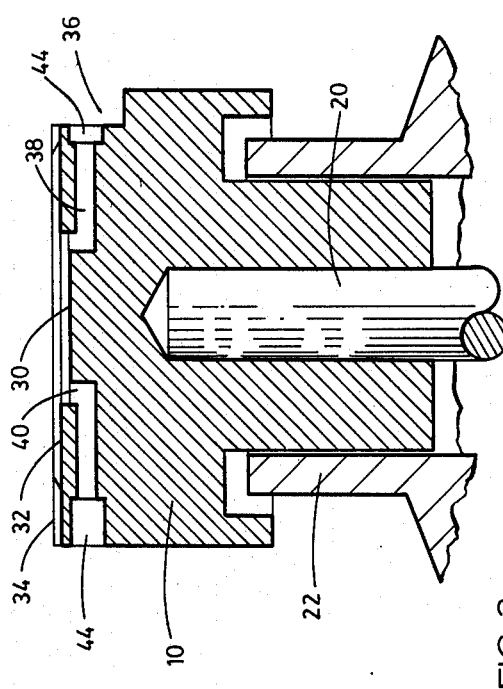
FIG. 3 is a cross-sectional view of the head shown in FIG. 2, on a further enlarged scale.
Figure 4:
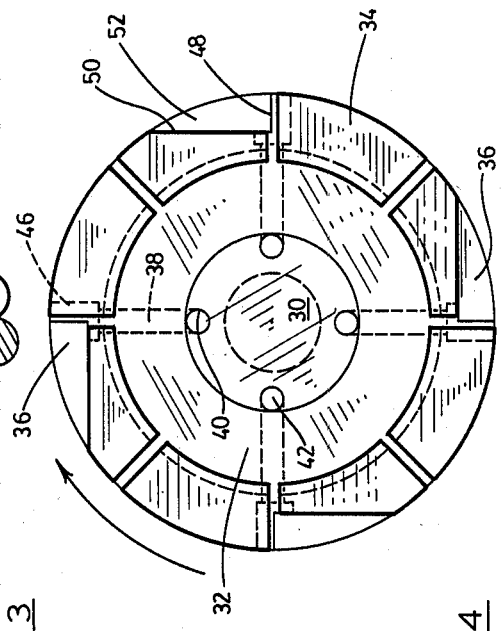
FIG. 4 is a top plan view of the head.

The pin 20 is received within the axial bore defined in the head 10, FIG. 3, and serves releasably to couple the head 10 with the shaft 16. As a practical matter, the pin 20 is received by the bore defined in the head 10 in friction-fit engagement, requiring a use of no additional coupling devices.

It also is important to note that the bowl 12 is provided with an upstanding sleeve 22 which is, in turn, concentrically related to an upstanding neck 24 integral with the head 10. A skirt 26 extends downwardly from the periphery of the head into overlapping relation with the sleeve 22, whereby contamination by liquid etchant, spilled or otherwise deposited within the bowl 12, is greatly reduced or even eliminated.

It should now be apparent that the head 10 is mounted on the shaft 16 adapted to be driven in rotation about a vertical axis common to the axis of rotation for the shaft 16. Thus the head 10 is mounted to be driven at a rate common to the shaft 16. As shown, the head 10 includes a disk-shaped vacuum chamber 30 circumscribed by an annular planar surface 32. The surface 32 is, in turn, circumscribed by an annular array of protuberances which collectively define an annular crown 34. It is to be understood, of course, that a silicon chip when deposited on the surface 32 is supported against radial displacement by the crown 34 and that an hermetic seal is established between the planar surface 32 and the adjacent engaged surface of the chip. Consequently, it is possible to evacuate the chamber 30 for purposes of establishing an atmospheric pressure differential across a chip seated on the surface 32 for thereby securing the chips to the head 10.

Evacuation of the chamber 30 is achieved through the use of a plurality of low-pressure cavities 36 defined about the periphery of the head 10 and connected in communication with the chamber 30 via radially projected bores 38. It is noted that each of the bores 38 includes a vertical segment 40 which communicates with the chamber 30 through a vacuum port 42. These ports are defined in the floor, not designated, of the chamber 30. Each of the bores 38 also includes a terminal segment 44 which communicates with one of the low-pressure cavities 36 via a discharge port 46.

At this juncture, it should be noted that each of the low-pressure cavities 36 is defined by a leading wall 48, an inner wall 50 and a horizontally oriented floor 52 normally related to the walls 48 and 50. Moreover, it can be seen that each of the cavities 36 comprises an open-top cavity which communicates with the upper surface of the head 10, as well as the peripheral surface thereof, while the planes of the walls thereof intersect at right angles along the center line of the radially projected bores.

Consequently, it should be appreciated that as the head 10 is driven in rotation, in a direction such that the walls 48 for the cavities are leading relative to the cavities 36, a negative pressure is developed within each of the low-pressure cavities, due to the well-known "Bernoulli" effect. The negative pressures developed in the cavities 36 simultaneously are translated to the vacuum chamber 30, via the bores 38 for effecting an evacuation thereof, when, of course, the chamber 30 is hermetically sealed by a workpiece or silicon chip seated on the annular surface 32 in sealing relation therewith.

OPERATION

It is believed that in view of the foregoing description of the invention, the operation of the device will readily be understood, however, it will be reviewed briefly at this point in the interest of assuring a complete understanding of the invention and its operation.

With the head 10 mounted on a shaft 16, for a high-speed motor, such as the dry-nitrogen driven turbine 14 depicted in FIG. 2, the head 10 is readied for operation by seating a workpiece such as a silicon chip, on the annular surface 32.

In performing a desired etching of the chip, the motor 14 is energized for imparting rotation to the head, via the shaft 16 and pin 20 attached thereto by the chuck 18 at a progressively increasing rate. Of course, as the head 10 rotates, the relative velocity of the surrounding atmosphere increases as it is thus caused to pass over the cavities 36 and ports 46 for thereby causing a low pressure to be produced in communication with each of the ports 46. This low pressure then is translated to the chamber 30 via the bores 38. Due to the atmospheric pressure bearing on the chip, at the upper surface thereof, and the low pressure now established within the chamber 30, the chip is secured in place for accommodating subsequent processing, such as the profiling thereof utilizing an etchant.

In view of the foregoing, it is believed to be readily apparent that the head of the instant invention provides a practical solution to many of the problems heretofore encountered by those engaged in profiling silicon chips utilizing etchants and the like.

What is claimed is:

1. A head for a vertically oriented, high-speed spinner characterized by a negative pressure chuck comprising:
   A. a body having a substantially cylindrical peripheral surface and a transverse end surface adapted to be connected to a vertically oriented drive shaft and supported thereby for unidirectional rotation about a vertical axis of rotation including,
      means defining in the end surface an outwardly facing chamber circumscribed by an annular work-supporting surface adapted to receive in hermetically sealed relation, an impervious work piece;
   B. means responsive to a rotation of said body about said axis, in the presence of a work piece received by said work-supporting surface, for reducing atmospheric pressure in said chamber including,
      a plurality of angularly spaced, low-pressure cavities uniformly spaced about the periphery of the body in communicating relation with the peripheral and end surfaces thereof, each cavity being defined by a first surface projected into the body in the plane of the axis at the leading portion of the cavity relative to the direction of rotation thereof, a second surface extended from the peripheral surface of the body along a chord thereof, in a plane paralleling the axis and intersecting said first surface, and a third surface intersecting said first and second surfaces and extended in a plane transversely related to said axis; and
   C. means for connecting each of said cavities in communicating relation with said vacuum chamber including,
      a segmented bore having a first segment projected through said second surface and extended to communicate with said chamber.

* * * * *